(12) United States Patent
Ishii et al.

(10) Patent No.: US 9,903,497 B2
(45) Date of Patent: Feb. 27, 2018

(54) FLOW CONTROL VALVE AND A MASS FLOW CONTROLLER USING THE SAME

(71) Applicant: Hitachi Metals, Ltd., Minato-ku, Tokyo (JP)

(72) Inventors: Mamoru Ishii, Mie-ken (JP); Ryu Sasaki, Mie-ken (JP)

(73) Assignee: Hitachi Metals, Ltd., Tokyo (JP)

( * ) Notice: Subject to any disclaimer, the term of this patent is extended or adjusted under 35 U.S.C. 154(b) by 134 days.

(21) Appl. No.: 15/025,061

(22) PCT Filed: Sep. 17, 2014

(86) PCT No.: PCT/JP2014/074576
§ 371 (c)(1),
(2) Date: Mar. 25, 2016

(87) PCT Pub. No.: WO2015/045987
PCT Pub. Date: Apr. 2, 2015

(65) Prior Publication Data
US 2016/0245422 A1 Aug. 25, 2016

(30) Foreign Application Priority Data
Sep. 30, 2013 (JP) .................................. 2013-203820

(51) Int. Cl.
*F16K 31/02* (2006.01)
*F16K 31/00* (2006.01)
(Continued)

(52) U.S. Cl.
CPC .............. *F16K 31/007* (2013.01); *F16K 7/14* (2013.01); *H01L 41/083* (2013.01); *H01L 41/09* (2013.01)

(58) Field of Classification Search
CPC .......... F16K 31/007; F16K 7/14; H01L 41/09; H01L 41/083
(Continued)

(56) References Cited

U.S. PATENT DOCUMENTS 4,284,263 A * 8/1981 Newcomb .......... F02M 51/0603
137/468
5,100,100 A * 3/1992 Benson ................ F16K 31/007
137/486

(Continued)

FOREIGN PATENT DOCUMENTS

JP 10148248 A 6/1998
JP 2003278943 A 10/2003
(Continued)

OTHER PUBLICATIONS

The Japanese Patent Office, "Japanese Search Report", dated Dec. 17, 2014, p. 8, Published in: JP.

*Primary Examiner* — Minh Le
(74) *Attorney, Agent, or Firm* — Neugeboren O'Dowd, PC (57) ABSTRACT

A first thermal shield constituted by a material with a thermal conductivity of 20 W/(m·K) or less and a second thermal shield constituted by a space are disposed between a passage and a laminated piezoelectric actuator. Preferably, a third thermal shield with a thermal conductivity of 20 W/(m·K) or less is further disposed. Thereby, a flow control valve which can effectively intercept a transmission of heat using a simpler and compacter structure than a flow control valve according to a conventional technology so that the temperature of a laminated piezoelectric actuator does not exceed its heat-resistant temperature even when it is used for high-temperature process gas is provided.

18 Claims, 4 Drawing Sheets

(51) Int. Cl.
*H01L 41/083* (2006.01)
*F16K 7/14* (2006.01)
*H01L 41/09* (2006.01)

(58) Field of Classification Search
USPC ....... 137/486, 487.5, 315.05, 334, 338, 339, 137/343; 251/129.01, 129.17, 331, 335.1, 251/335.2, 368
See application file for complete search history.

(56) References Cited

U.S. PATENT DOCUMENTS

| | | | | |
|---|---|---|---|---|
| 5,281,885 A * | 1/1994 | Watanabe | ............. | F16K 31/007 251/129.01 |
| 5,470,045 A * | 11/1995 | Kazama | ................. | F16K 31/06 251/129.15 |
| 5,582,208 A * | 12/1996 | Suzuki | ...................... | F16K 1/34 137/625.29 |
| 6,073,646 A * | 6/2000 | Kimura | ...................... | F16K 7/14 137/315.05 |
| 6,274,967 B1 * | 8/2001 | Zumstrull | ........... | H01L 41/0475 310/328 |
| 6,289,923 B1 * | 9/2001 | Ohmi | .................. | G05D 7/0635 137/486 |
| 6,345,803 B2 * | 2/2002 | Sakurai | ................ | F16K 31/007 251/129.02 |
| 7,332,040 B1 * | 2/2008 | Kojima | ............... | C23C 16/4481 118/715 |
| 8,162,286 B2 * | 4/2012 | Sawada | .................... | F16K 7/14 251/129.02 |
| 8,181,932 B2 * | 5/2012 | Matsumoto | ............... | F16K 7/14 251/129.02 |
| 8,757,197 B2 * | 6/2014 | Hirata | .................. | G05D 7/0635 137/487.5 |
| 8,807,014 B2 * | 8/2014 | Nitta | ....................... | F04B 43/02 92/103 M |
| 9,455,398 B2 * | 9/2016 | Makisako | ............. | H01L 41/053 |
| 2010/0037959 A1 * | 2/2010 | Kamaishi | .................. | G01F 1/68 137/14 |
| 2012/0273061 A1 * | 11/2012 | Hidaka | ..................... | F16K 7/14 137/334 |
| 2014/0109995 A1 * | 4/2014 | Moler | .................. | G05D 7/0635 137/487.5 |
| 2014/0374634 A1 * | 12/2014 | Ohtsuki | ................. | G05D 7/0635 251/129.06 |
| 2015/0369378 A1 * | 12/2015 | Umeyama | ................ | F16K 1/42 137/486 |

FOREIGN PATENT DOCUMENTS

| | | |
|---|---|---|
| JP | 2004162733 A | 6/2004 |
| JP | 2007500316 A | 1/2007 |
| JP | 2011117499 A | 6/2011 |

\* cited by examiner

FLOW CONTROL VALVE AND A MASS FLOW CONTROLLER USING THE SAME

TECHNICAL FIELD

The present invention relates to a flow control valve, and in particular, but not by way of limitation, the present invention relates to a structure of a flow control valve improved so that it can be used for high-temperature fluid and a mass flow controller using the flow control valve.

BACKGROUND

A mass flow controller is widely used in order to control the supply amount of process gas supplied into a chamber in a manufacturing process of a semiconductor. A mass flow controller is constituted by a mass flowmeter which monitors a mass flow rate of process gas, a flow control valve and a control circuit which control the mass flow rate, etc. Furthermore, the flow control valve is constituted by a passage through which the process gas flows, a valving element which opens the passage at a predetermined opening position or intercepts the same, and an actuator which drives the valving element.

In the technical field of a semiconductor, miniaturization and high integration have proceeded to a limit. For example, in the case of a microprocessor used for the newest personal computer, the width of a wiring circuit is made finer to about 20 nm, and a plurality of cores are mounted in one piece of microchip. In order to perform a film forming process and fabrication process of a semiconductor having such a precise and complicated structure with a high accuracy, various kinds of process gas which has not been used conventionally is used increasingly.

For instance, although there is a possibility that vaporization gas of a certain kind of liquid material and sublimation gas of a certain kind of solid material may condense in a piping at an ordinary temperature since their vapor pressure is very low, it has been attempted to introduce such a condensable gas into a semiconductor manufacturing equipment without condensation and to use it for a manufacturing process of a semiconductor, by heating and holding all the piping system leading to a chamber at an elevated temperature not less than a critical temperature (for instance, not less than 300° C.).

However, a heat-resistant temperature of a laminated piezoelectric actuator widely used as an actuator which drives a valving element of a flow control valve is generally 120° C., and it is 150° C. even in the case of an actuator for an elevated temperature. At a temperature higher than this heat-resistant temperature, an insulation breakdown of an internal electrode occurs within a short time, and it becomes impossible to drive a valving element.

Therefore, even when condensable gas at an elevated temperature is dealt with in a mass flow controller, some proposals for preventing the temperature of a laminated piezoelectric actuator from rising and holding it not higher than its heat-resistant temperature have been made. For instance, Japanese Patent Application Laid-Open "kokai" No. 2004-162733 discloses a configuration of a flow control valve comprising a spacer which is located between a laminated piezoelectric actuator and a valving element, transmits the operation of the laminated piezoelectric actuator to the valving element, and radiates heat transmitted from the valving element side. In this flow control valve, since most heat transmitted from the fluid to be controlled is emitted to open air from a cooling fin disposed on the outer periphery of the spacer, the rise in temperature of the laminated piezoelectric actuator is suppressed.

Moreover, for example, Japanese Patent Application Laid-Open "kokai" No. 2011-117499) discloses a configuration of a flow control valve comprising a spacer for lifting and supporting a laminated piezoelectric actuator so as to keep the laminated piezoelectric actuator away from a passage of fluid and for radiating heat transmitted from the fluid to the laminated piezoelectric actuator. In this flow control valve, the heat received from the fluid is radiated while being transmitted from the lower end portion to the top end portion of the spacer, and the length (height dimension) of the spacer is set to be longish so that the temperature of the part contacting the laminated piezoelectric actuator may become not more than the heat-resistant temperature of the laminated piezoelectric actuator.

SUMMARY

Both the above-mentioned flow control valves according to conventional technologies are intended to suppress (reduce) heat transmitted to a laminated piezoelectric actuator by their configuration in which heat is radiated toward the outer periphery of the spacer during the process in which the heat transmitted from high-temperature fluid to the valving element is further transmitted to the laminated piezoelectric actuator through the spacer as a channel of heat conduction, and exert a certain effect in this point.

However, since no special attention is paid to an interception of a transmission of heat from fluid which is a heat source to a spacer, the above-mentioned flow control valves according to conventional technologies have various problems to be solved. Specifically, first of all, since the length of a spacer has to be lengthen in order to obtain sufficient cooling effect, the size of a mass flow controller must be enlarged in its height direction or the number of laminated layers in a laminated piezoelectric actuator must be reduced to shorten its length in order to keep the same height as a conventional device, inescapably. When the size of a mass flow controller is enlarged, replacement with a conventional instrument becomes difficult in the light of an installation space. Moreover, when the number of laminated layers in a laminated piezoelectric actuator is reduced, the amount of its maximum displacement decreases, and the capacity of flow rate when a valve is opened becomes small.

Secondly, since the flow control valve according to a conventional technology depends mainly on heat radiation from a spacer for temperature-rising prevention of a laminated piezoelectric actuator, an unignorable quantity of heat is emitted from a passage to the outside of a mass flow controller through a spacer. Then, in order to prevent the temperature of fluid from falling, it becomes necessary to compensate with the lost heat by increasing the heating value of a heater disposed in the passage, and the power consumption as the whole mass flow controller increases.

Thirdly, since a spacer having a comparatively long shape must be incorporated between a fluid passage and a laminated piezoelectric actuator in a flow control valve according to a conventional technology, a problem of a spacer's own thermal expansion raises. In order to mitigate the influence by the thermal expansion of a spacer, for example, a spacer must be constituted using invar alloy which is expensive as compared with a common material, and the increase in manufacturing cost cannot be avoided.

The present invention has been made in view of the above-mentioned problems, and intends to provide a flow control valve having excellent thermal insulation properties which can efficiently intercept a transmission of heat to a laminated piezoelectric actuator by a simpler and compacter structure than a flow control valve according to a conventional technology.

The inventors thought that it would be effective to arrange a thermal shield which intercepts a transmission of heat in a location as close to a heat source as possible in order to effectively intercept a transmission of heat from fluid which is a heat source to a laminated piezoelectric actuator. In a flow control valve, the heat source closest to a laminated piezoelectric actuator is a diaphragm. Then, first, the inventors attempted to intercept a transmission of heat from fluid to an actuator through a diaphragm by respectively configuring a ring-like member which presses and fixes the outer periphery of the diaphragm on the main part of the flow control valve and a diaphragm spacer which reversibly displaces the central part of the diaphragm toward a valve seat and controls the opening position of an aperture of a valve seat, as a first thermal shield consisting of a ceramic material with a thermal conductivity of 20 W/(m·K)(W·m-1·K-1) or less.

However, in accordance with the inventors' examination, it was found out that the rise in temperature of a laminated piezoelectric actuator cannot be efficiently prevented only by the above-mentioned configuration since the heat transmitted to the ring-like member and the diaphragm spacer was transmitted to some extent to the laminated piezoelectric actuator through another member as a channel of heat conduction in fact.

Then, the inventors have found that transmission of heat from a ring-like member and a diaphragm spacer to a laminated piezoelectric actuator can be quite efficiently intercepted and the rise in temperature of the laminated piezoelectric actuator can be prevented by constituting a space surrounded by the above-mentioned first thermal shield and a stress transferring means which transmits a stress generated in the laminated piezoelectric actuator to the diaphragm spacer as a second thermal shield, and have completed the present invention.

Namely, the present invention is an invention of a flow control valve comprising a base, a valve seat, a diaphragm, a ring-like member, a diaphragm spacer, a laminated piezoelectric actuator and a stress transferring means, characterized in that both the ring-like member and diaphragm spacer constitute a first thermal shield consisting of a ceramic material with a thermal conductivity of 20 W/(m·K) or less, and a space surrounded by the first thermal shield and the stress transferring means constitutes a second thermal shield.

Moreover, the present invention is an invention of a mass flow controller which comprises the above-mentioned flow control valve.

In accordance with the configuration of the present invention, since a plurality of thermal shields are disposed at a location close to fluid which serves as a heat source, in spite of its simpler and compacter structure as compared with a conventional technology, the temperature of a laminated piezoelectric actuator can be maintained below its heat-resistant temperature.

DETAILED DESCRIPTION

Embodiments for carrying out the present invention will be explained in detail using drawings.

The embodiments explained here are nothing more than exemplification of embodiments of the present invention, and embodiments of the present invention are not limited to the embodiments exemplified here.

Figure 1:
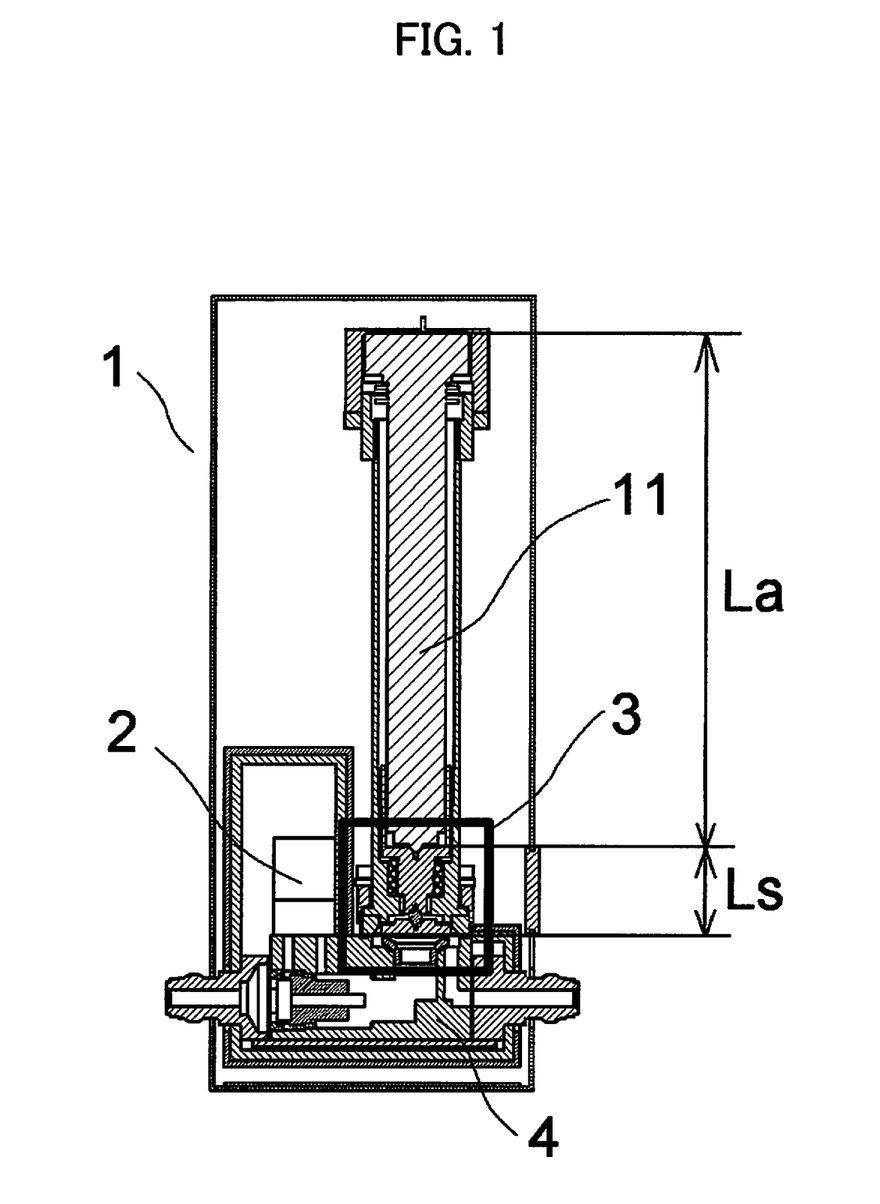
FIG. 1 is a schematic diagram of a mass flow controller according to one embodiment of the present invention.

FIG. 1 is a schematic diagram for showing the whole structure of a mass flow controller 1 according to the present invention. Fluid which is a controlled object flows through a passage formed in a base 4 from left side to right side of the drawing. The mass flow rate per unit time (flow velocity) of the fluid which flows through the passage is measured successively by a mass flow meter 2. The mass flow rate of the fluid which flows through the passage is controlled to be a value which an operator wishes, by a flow control valve 3 indicated in a square enclosure. The opening position of a valve of the flow control valve 3 is controlled by a laminated piezoelectric actuator 11. The amount of displacements of the laminated piezoelectric actuator 11 is adjusted by a control circuit which is not shown. Moreover, the passage can be heated with a heater which is not sown, in order to prevent condensation of condensable gas in the passage.

Figure 2:
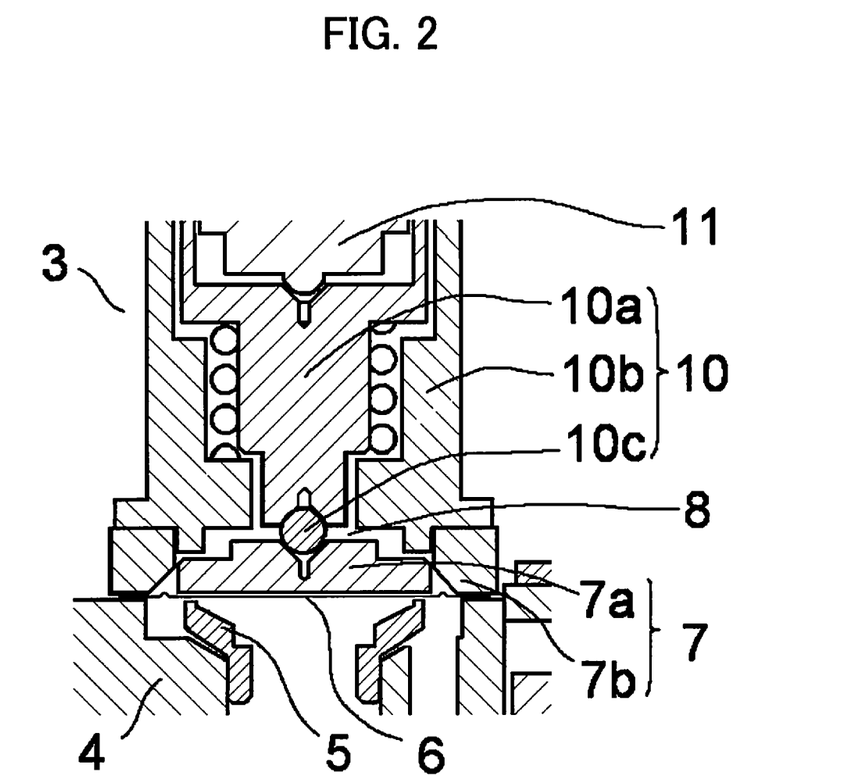
FIG. 2 is a partially enlarged view of a flow control valve of the mass flow controller in FIG. 1.

FIG. 2 is a partially enlarged view of a flow control valve 3 shown in FIG. 1. An annular valve seat 5 is formed to communicate with the passage formed in the base 4 of the flow control valve. The aperture of the valve seat 5 faces one surface of the base 4. A diaphragm 6 consists of a sheet-like elastic body. The outer periphery of the diaphragm 6 is pressed and fixed by a ring-like member 7b. The ring-like member 7b is located on the side opposite to the valve seat 5 behind the diaphragm 6. The central part of said diaphragm is displaced toward the valve seat 5 or inversely by a diaphragm spacer 7a, and the opening position of the aperture of the valve seat 5 is controlled. The diaphragm spacer 7a is located on the side opposite to the valve seat 5 behind the diaphragm 6. A stress transferring means 10 consists of a valve stem 10a, a casing 10b, and a spherical member 10c.

Stress generated by expansion of the laminated piezoelectric actuator 11 is transmitted to the diaphragm spacer 7a through the valve stem 10a and the spherical member 10c, the diaphragm 6 is displaced toward the valve seat 5, and the flow control valve 3 is closed. When the laminated piezoelectric actuator 11 contracts, the stress which pushed the diaphragm 6 on the valve seat 5 is released, the central part of the diaphragm 6 is displaced in a direction opposite to the valve seat 5 in accordance with restoring force which the diaphragm 6 originally has, and the flow control valve 3 is opened. In addition, although FIG. 2 shows a structure of what is called a normal open type of flow control valve, the flow control valve according to the present invention is not limited to a normal open type, and may be what is called a normal closing type.

Next, the first thermal shield according to the present invention will be explained.

In the present invention, both the diaphragm spacer and the ring-like member consists of a material with a thermal conductivity of 20 W/(m·K) or less, and the both constitute a first thermal shield 7. Thermal conductivity used in the present invention can be represented with its value at a room temperature. As the material with a thermal conductivity of 20 W/(m·K) or less, yttria (thermal conductivity: 14 W/(m·K)), silicon nitride (thermal conductivity: 13 W/(m·K)), zirconia (thermal conductivity: 3.0 W/(m·K)), etc. can be employed, for example. By constituting the first thermal shield by such a material with a thermal conductivity of 20 W/(m K) or less, the transmission of the heat supplied through the diaphragm from fluid which is a heat source to the laminated piezoelectric actuator can be suppressed. The value of the thermal conductivity of the material which constitutes the first thermal shield is preferably 10 W/(m·K) or less, and more preferably 5.0 W/(m·K) or less.

In a preferable embodiment of the present invention, the material which constitutes the first thermal shield is one sort or two sorts of ceramic materials chosen from a group consisting of MACOR ("MACOR" is a registered trademark of Coning, Incorporated) and zirconia. Since metallic material and alloyed material have high thermal conductivity in general, it is preferable to use a ceramic material for the diaphragm spacer and the ring-like member. The values of thermal conductivity at a room temperature are 1.7 W/(m·K) for MACOR and 3.0 W/(m·K) for zirconia, and both have a very high thermal-insulation effect. Moreover, since the mechanical strength of zirconia is high as compared with that of MACOR, zirconia is more preferable when strength of a member is required. In the present invention, it is not necessary to use an identical material as the material with a thermal conductivity of 20 W/(m·K) or less for all the members, and about each member, and a suitable material can be properly chosen to be used for individual members.

In a preferable embodiment of the present invention, the thicknesses of both the diaphragm spacer and the ring-like member are within a range which does not exceed 20 mm. Since these members consist of a material with a low thermal conductivity, even when their thickness is limited within the range which does not exceed 20 mm, sufficient thermal-insulation effect can be acquired. The thickness which exceeds 20 mm is not preferable, since the height of a flow control valve becomes unnecessarily high even though the thermal-insulation effect does not change so much as compared with the case where the thickness does not exceed 20 mm. The upper limit of the thickness is preferably 15 mm, and more preferably 10 mm.

In a preferable embodiment of the present invention, the inner diameter of the ring-like member is larger than the outer diameter of the diaphragm spacer, and the gap between them does not exceed 2.0 mm. By making the inner diameter of the ring-like member larger than the outer diameter of the diaphragm spacer, the diaphragm spacer can be stored inside the inner diameter of the ring-like member. Moreover, by keeping the space between them from exceeding 2.0 mm, heat leaking from the gap between them and transmitted to the laminated piezoelectric actuator can be reduced. Namely, the ring-like member and the diaphragm spacer are thermally united to constitute the first thermal shield, and exert an effect to intercept the heat transmitted from the diaphragm and prevent it from being transmitted to the laminated piezoelectric actuator.

Moreover, since the diaphragm spacer and the ring-like member according to the present invention themselves have heat capacities, they not only intercept heat, but function as lagging materials. Namely, the ring-like member and the diaphragm spacer provide a function to maintain the temperature of the diaphragm at the same temperature as the temperature of fluid so as to prevent the temperature of the diaphragm from becoming lower than the temperature of the fluid and thereby to prevent the fluid from condensing inside the diaphragm.

When the outer diameter of the diaphragm spacer is smaller than the inner diameter of the valve seat, the diaphragm which contacts directly with fluid is exposed to the space which constitutes a second thermal shield in a region which is outside the outer diameter of the diaphragm spacer of the diaphragm and is inside the inner diameter of the valve seat. As a result, in this exposed region, heat is easily transmitted to the laminated piezoelectric actuator side not through the diaphragm spacer. Therefore, in a preferable embodiment of the present invention, it is preferable that the outer diameter of the diaphragm spacer is the same as that of the valve seat or somewhat larger than it. Thereby, an opening-and-closing operation of the valving element by a diaphragm can be certainly performed, and heat can be prevented from easily leaking through the region where the diaphragm is exposed as mentioned above. Namely, the heat transmitted from fluid to the diaphragm can be intercepted efficiently.

In order to improve spring elasticity, an annular concavo-convex portion may be prepared in the diaphragm. In this case, it is necessary to make the outer diameter of the diaphragm spacer smaller than the diameter of the concavo-convex portion so that a pressing surface of the diaphragm spacer does not contact the concavo-convex portion.

In a preferable embodiment of the present invention, the outer diameter of the ring-like member is preferably almost equal to the outer diameter of the diaphragm. Thereby, the heat transmitted from the fluid to the diaphragm can be intercepted certainly. When an annular concavo-convex portion is prepared in the diaphragm as mentioned above, it is preferable to prepare a bevel, etc. on the inner diameter of the ring-like member on the side which contacts the diaphragm, so that it does not contact the above-mentioned concavo-convex portion.

Next, the second thermal shield according to the present invention will be explained.

In the present invention, a space surrounded by the first thermal shield, which is constituted by the diaphragm spacer and the ring-like member, and the stress transferring means constitutes a second thermal shield. The space which constitutes the second thermal shield is a space which is surrounded by the first thermal shield and the stress transferring means, i.e. a space which exists between the first thermal shield and the stress transferring means. Specifically, such a space can be attained by forming a concave portion on the surface of the member or making an air gap between the members at the stage of designing a flow control valve. For instance, in the example of FIG. 2, a space which constitutes the second thermal shield 8 between the diaphragm spacer 7a and the valve stem 10a is realized by disposing the spherical member 10c between the diaphragm spacer 7a and the valve stem 10a. Moreover, the space between the diaphragm spacer 7a and the casing 10b also constitutes the second thermal shield together with the previously mentioned space. In this example, when the size of the spherical member 10c is enlarged, the spherical member 10c itself serves as a channel of heat conduction and the effect of the second thermal shield is inhibited. Therefore, it is preferable that the size of the spherical member 10c is a minimum size required for transmitting a stress.

In a preferable embodiment of the present invention, the space which constitutes the second thermal shield is filled with air. Since air is gas, its heat capacity per unit volume is small as compared with a ceramic material. However, its thermal conductivity has a low value of 2.4 W/(m·K), which is comparable to the thermal conductivities of MACOR and zirconia. Therefore, its effect to intercept transmission of heat is high. For this reason, heat can be effectively prevented from being transmitted from the first thermal shield 5 to the stress transferring means or the laminated piezoelectric actuator. The air which exists in the second thermal shield consists of the air which remains in the second shielding in a process in which the flow control valve 3 is assembled, for example. Although the components of this air are determined by the atmosphere at the time of the assembly, it is preferable that the air is pure and moisture vapor is as little as possible.

It is more preferable to make the second thermal shield into an airtight structure, since the intercepting effect of heat can be further heightened by encapsulating rare gas, such as xenon and krypton, with a very low thermal conductivity. Moreover, if possible, it is further preferable to evacuate the space of the second thermal shield, since thermal conduction by conduction and convection can be avoided.

In a preferable embodiment of the present invention, it is preferable that the size (cross section area) of the space which constitutes the second thermal shield in the cross section intersecting perpendicularly with the pressing direction (displacement direction) of the diaphragm has an area equivalent to that of the diaphragm and the height (size in the pressing direction of the diaphragm) of the above-mentioned space is 0.5 mm or more. The heat transmitted from the fluid as a heat source through the diaphragm can be intercepted effectively, when the cross section of the above-mentioned space has an area equivalent to that of the diaphragm. Moreover, the distance for which heat is delivered within the second thermal shield can be lengthened and thereby heat can be effectively intercepted, when the height of the above-mentioned space is 0.5 mm or more. The more preferable range of the height of the space which constitutes the second thermal shield is 1.0 mm or more. Moreover, it is preferable the upper limit of the height of the above-mentioned space is 10 mm, since the height of a flow control valve becomes high when the height of the above-mentioned space exceeds 10 mm.

Next, a third thermal shield according to the present invention will be explained.

Figure 3:
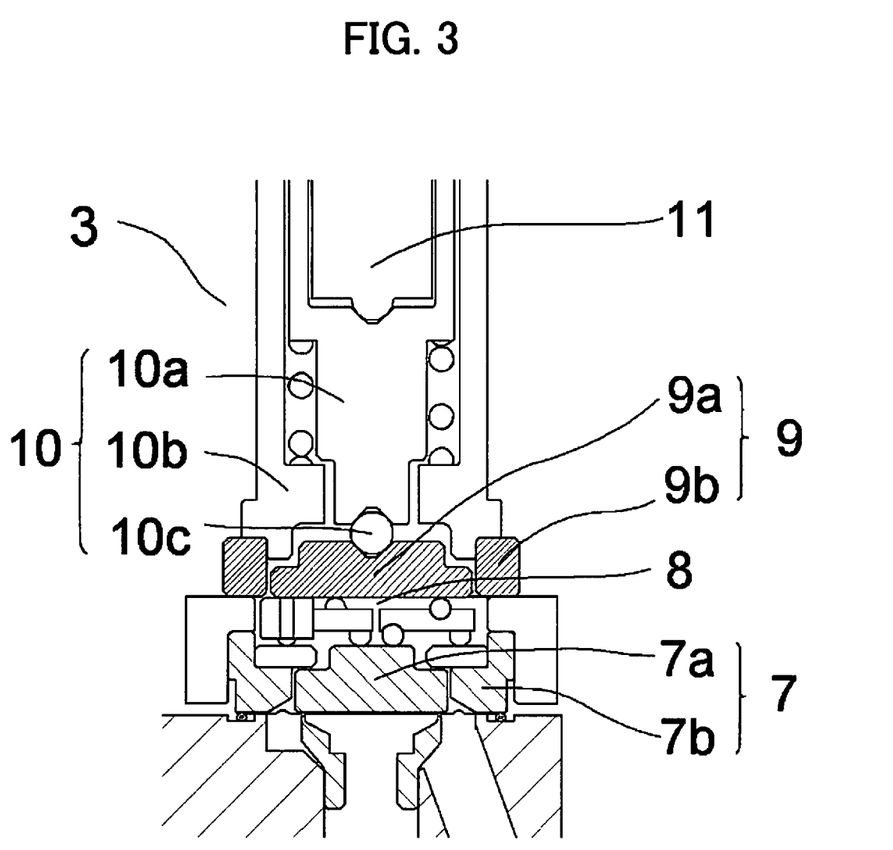
FIG. 3 is a partially enlarged view of a flow control valve according to another embodiment of the present invention.

FIG. 3 is a partially enlarged view of a flow control valve according to preferable embodiment of the present invention. In this preferable embodiment, a third thermal shield consisting of a material with a thermal conductivity of 20 W/(m·K) or less is prepared between the second thermal shield 8 and the stress transferring means 10. By preparing the third thermal shield, the transmission of heat from the second thermal shield to the stress transferring means is inhibited, and the effect of prevention of the rise in temperature of the laminated piezoelectric actuator increases further.

In a preferable embodiment of the present invention, the third thermal shield consists of a disc-like member 9a located in the center and a ring-like member 9b arranged around the disc-like member 9a as needed. The preferable material and shape of the disc-like member 9a and the ring-like member 9b are the same as the quality of the material and shape of the diaphragm spacer 7a and the ring-like member 7b are preferable.

Although the third thermal shield 9 is prepared at an intermediate position between the second thermal shield 8 and the stress transferring means 10 as mentioned above, the stress from the laminated piezoelectric actuator 11 cannot be transmitted to the diaphragm 6 when the stress transferring means does not exist at an intermediate position between the first thermal shield 7 and the third thermal shield 9, but the third thermal shield 9 consists of only space. So, in this configuration, it is necessary to further prepare a means for transmitting stress between the first thermal shield 7 and the third thermal shield 9. This additional stress transferring means may be a member equivalent to the spherical member 10c shown in FIG. 2, or may be an amplification mechanism shown in FIG. 3 (the same thing as the amplification mechanism disclosed in Japanese Patent Application Laid-Open "kokai" No. H10-148248), for example. Here, an amplification mechanism means a mechanical mechanism which has a function to amplify the amount of a displacement of a laminated piezoelectric actuator using the principle of leverage and transmit it.

Next, the material which constitutes a member included in the stress transferring means will be explained.

The valve stem 10a has a function to transmit the stress generated by an expansion or compression of the laminated piezoelectric actuator 11 to the third thermal shield 9. For this reason, it is preferable that the valve stem 10a is constituted material having a sufficient strength and corrosion resistance (for instance, stainless steel, etc.). Moreover, since the valve stem 10a has a large cross section which intersects perpendicularly with the pressing direction (displacement direction), it may serve as a channel of the heat, which could not be completely blocked with the second thermal shield 8 or the third thermal shield 9, conducted to the laminated piezoelectric actuator 11. For this reason, it is also more preferable to constitute the valve stem 10a by material which has a thermal conductivity of 20 W/(m·K) or less (for instance, zirconia, etc.).

The casing 10b has a function to store (house) the valve stem 10a and the laminated piezoelectric actuator 11 and to fix the location of the upper end of the laminated piezoelectric actuator 11. For this reason, it is preferable that the casing 10b is constituted by material with a low heat expansion coefficient (for instance, 42 alloy (Fe alloy containing 42 mass % of nickel), etc.). As material for the spherical member 10c, a steel ball for bearings, etc. can be used, for example.

Next, the cooling means according to the present invention will be explained.

Figure 4:
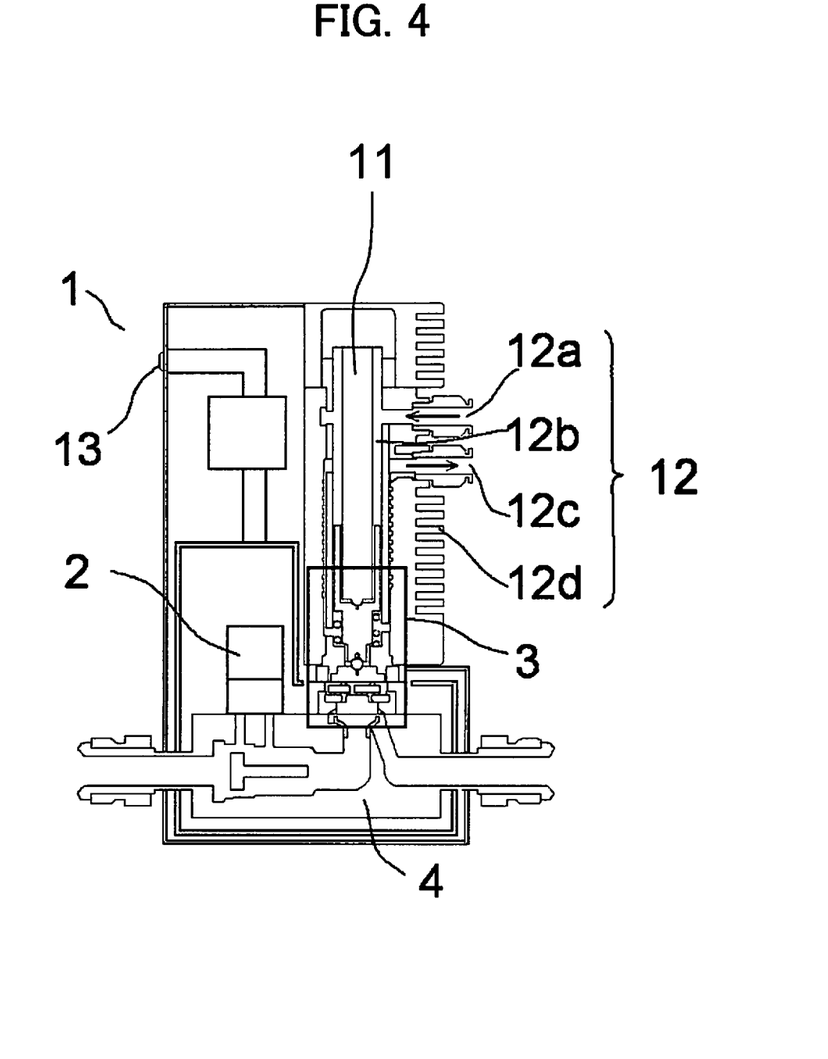
FIG. 4 is a schematic diagram of a mass flow controller according to another embodiment of the present invention.

FIG. 4 is a schematic diagram of a mass flow controller according to a preferable embodiment of the present invention. In this preferable embodiment, the whole lateral face of the laminated piezoelectric actuator 11 is covered with a cooling hood 12b, and a heat exchange takes place between coolant gas and the lateral face of the laminated piezoelectric actuator 11 by sending the coolant gas from a coolant gas inlet 12a thereto, and the laminated piezoelectric actuator 11 is cooled. The coolant gas warmed with the heat of the laminated piezoelectric actuator 11 is discharged outside from a coolant gas outlet 12c. A heat radiating member 12d may be prepared outside the cooling hood 12b. Moreover, a cooling fin which contacts with the laminated piezoelectric actuator 11 may be further prepared in a gap between the laminated piezoelectric actuator 11 and the cooling hood 12b.

By forming the cooling means 12 which consists of these constituents in the surroundings of the laminated piezoelectric actuator 11, even if the temperature of the laminated piezoelectric actuator 11 was raised, it is more certainly prevented from being raised higher than its heat-resistant temperature by being actively cooled from the outside. The coolant gas which flows through the cooling hood 12b just has to be gas at a temperature lower than the heat-resistant temperature of the laminated piezoelectric actuator 11, and it is poured into the inside of the cooling hood 12b from the coolant-gas inlet 12a after being cooled by a well-known means.

Moreover, in place of or in conjunction with the above-mentioned configuration, a Peltier device may be used as a cooling means. Also in this case, the temperature of the laminated piezoelectric actuator can be prevented from being raised to a temperature higher than its heat-resistant temperature by preparing the Peltier device as a cooling means in the surroundings of the laminated piezoelectric actuator.

Next, the effect by the present invention will be explained.

The flow control valve according to the configuration of the present invention can intercept heat transmitted from fluid which is a heat source with a plurality of thermal shields, and can effectively prevent the heat from being transmitted to a laminated piezoelectric actuator. A plurality of the thermal shields prepared in accordance with the configuration disclosed in the present specification can make the temperature of the lower end of the laminated piezoelectric actuator be 110° C. or less, when the temperature of fluid which flows through the passage is 250° C., for example. Since the temperature of the lower end, which is usually the closest to the heat source, becomes the highest in the temperature distribution of the laminated piezoelectric actuator, the temperature of the whole laminated piezoelectric actuator becomes also 110° C. or less and will not exceed its heat-resistant temperature, when the temperature of the lower end is 110° C. or less. Therefore, in accordance with the flow control valve according to the configuration of the present invention, the flow rate of condensable gas heated at 250° C. can be certainly controlled.

Moreover, since an effect that intercepts heat is sufficiently acquired even when the lengths of the individual thermal shields are not long in accordance with the flow control valve according to the configuration of the present invention, the length of the whole thermal shield can be made compact. Specifically, for example, when La is defined as the length of the laminated piezoelectric actuator and Ls is defined as the distance from the diaphragm to the lower end of the laminated piezoelectric actuator, the value of La/(La+Ls) can be 0.65 or more and 0.95 or less. Thereby, the length of the laminated piezoelectric actuator occupying in the length of the whole flow control valve can be lengthen. Therefore, it is not necessary for the length of the flow control valve to be made longer than a conventional one, and it becomes easy to replace the conventional one with the same. Moreover, since it is not necessary to reduce the number of laminated layers in the laminated piezoelectric actuator due to a limit of its length, a problem in a conventional technology in which the maximum displacement decreases and the capacity of the flow rate at the time of valve opening becomes smaller can be solved. A more preferable range of the value of La/(La+Ls) is 0.70 or more and 0.90 or less.

The flow control valve according to the present invention is constituted based on the technical thought of shutting up in the passage the heat which fluid has as much as possible. For instance, since the first thermal shield can effectively intercept the heat transmitted from the diaphragm toward the outside, loss of heat is small as compared with a flow control valve according to a conventional technology, and less power consumption is needed when it is assembled in a mass flow controller. When the passage is actively heated with a heater as mentioned above, the loss of heat can be further reduced, for example, by covering the whole passage with heat insulating material together with the heater.

As mentioned above, in the flow control valve according to the present invention, the length of the laminated piezoelectric actuator occupying in the length of the whole flow control valve can be made long. In other words, since the height of the shield can be made small, an issue of the thermal expansion is relieved as compared with a flow control valve according to a conventional technology which adopts a spacer with a long length for heat radiation.

Next, a mass flow controller according to the present invention will be explained.

A mass flow controller 1 according to the present invention is constituted by using and combining the flow control valve 3 according to the present invention with the mass flowmeter 2 and other members. As a mass flow meter adopted for the mass flow controller according to the present invention, a thermal type mass flowmeter, a pressure type mass flow meter and other well-known mass flow meter can be used. By building in the flow control valve according to the present invention, the mass flow controller which attains the effect of the present invention as it is can be constituted.

In a mass flow controller, an electric circuit for control and/or communication is often built in a device. However, in the mass flow controller according to the present invention, it is preferable that a connector 13 for taking out an electrical signal from a mass flow controller and/or sending an electrical signal into a mass flow controller is prepared and all electric circuits are disposed outside the device, for example, as shown in FIG. 4, since there is a possibility that an electric circuit is heated and therefore causes a malfunction.

Example 1

Two cartridge heaters (voltage rating: 120 V, output power: 50 W) were attached to the surroundings of the passage 4 of the mass flow controller (La/(La+Ls)=0.85) shown in FIG. 1, the surroundings of the cartridge heaters were covered with a protective case, and heat insulating material was filled up between the cartridge heaters and the protective case. Moreover, thermocouples for temperature measurement were set at the cartridge heaters, the passage and the lower part of the laminated piezoelectric actuator, respectively.

Next, the cartridge heater was heated to a target temperature of 250° C. and left as it was until the temperatures of respective parts were stabilized while measuring the temperatures of the respective parts. The temperatures of the respective parts were stabilized 20 minutes later. As for the temperatures of the respective parts at this time, the cartridge heater was 250° C., the passage was 245° C. and the lower part of the laminated piezoelectric actuator was 135° C. The temperature of the lower part of the laminated piezoelectric actuator was lower than 150° C. which is a heat-resistant temperature of a laminated piezoelectric actuator for an elevated temperature.

Example 2

The temperatures of the respective parts were measured under the same condition as Example 1 using the mass flow controller (La/(La+Ls)=0.72) which has the cooling means 12 shown in FIG. 4. However, the thermocouples for temperature measurement were set at the cartridge heater, the central part of the diaphragm, the lower part of the laminated piezoelectric actuator and the outside of the cooling hood, respectively.

Next, the cartridge heater was heated to a target temperature of 250° C. while making room-temperature air flow from the coolant-gas inlet at only 20 slm (standard liter per minute) and left as it was until the temperatures of respective parts were stabilized while measuring the temperatures of the respective parts. The temperatures of the respective parts were stabilized 20 minutes later. As for the temperatures of the respective parts at this time, the cartridge heater was 250° C., the central part of the diaphragm was 228° C., the lower part of the laminated piezoelectric actuator was 110° C. and the outside of the cooling hood was 80° C. The temperature of the lower part of the laminated piezoelectric actuator was lower than 120° C. which is a heat-resistant temperature of a common laminated piezoelectric actuator.

As shown by these Examples, in accordance with the flow control valve according to the configuration of the present invention, yet with its simple and compact structure without using a spacer, conduction of heat from a passage to a laminated piezoelectric actuator is inhibited and the rise in temperature of the laminated piezoelectric actuator can be prevented even when a passage is heated in order to use high-temperature process gas. Therefore, the flow control valve according to the configuration of the present invention is effective in use with high-temperature process gas.

The invention claimed is:

1. A flow control valve comprising:
a base in which a passage of fluid is formed
an annular valve seat which communicates with said passage and has an aperture on one surface of said base,
a diaphragm which consists of a sheet-like elastic body arranged so as to cover the aperture of said valve seat,
a ring-like member which is located on the side opposite to said valve seat behind said diaphragm and pushes and fixes the outer periphery of said diaphragm on said base,
a diaphragm spacer which is located on the side opposite to said valve seat behind said diaphragm and controls the opening position of the aperture of said valve seat by displacing the central part of said diaphragm toward said valve seat or inversely,
a laminated piezoelectric actuator in which a plurality of piezoelectric elements are laminated, and
a stress transferring means which transmits stress generated by expansion of said laminated piezoelectric actuator to said diaphragm spacer,
characterized in that:
both said ring-like member and said diaphragm spacer constitute a first thermal shield consisting of a material with a thermal conductivity of 20 W/(m·K) or less, and
a space surrounded by said first thermal shield and said stress transferring means constitutes a second thermal shield.

2. The flow control valve according to claim 1, characterized by comprising:
a third thermal shield consisting of a material with a thermal conductivity of 20 W/(m·K) or less between said second thermal shield and said stress transferring means.

3. The flow control valve according to claim 1, characterized in that:
a cooling means is disposed around said laminated piezoelectric actuator.

4. The flow control valve according to claim 1, characterized in that:
said material with a thermal conductivity of 20 W/(m·K) or less is one sort or two sorts of ceramic materials chosen from a group consisting of MACOR (registered trademark) and zirconia.

5. The flow control valve of claim 1, characterized in that:
when the temperature of fluid which flows through said passage is 250° C., the temperature of the lower end of said laminated piezoelectric actuator is 110° C. or less, and
when La is defined as the length of said laminated piezoelectric actuator and Ls is defined as the distance from said diaphragm to the lower end of said laminated piezoelectric actuator, the value of $La/(La+Ls)$ is 0.65 or more and 0.95 or less.

6. A mass flow controller which comprises:
a base in which a passage of fluid is formed:
an annular valve seat which communicates with said passage and has an aperture on one surface of said base:
a diaphragm which consists of a sheet-like elastic body arranged so as to cover the aperture of said valve seat;
a ring-like member which is located on the side opposite to said valve seat behind said diaphragm and pushes and fixes the outer periphery of said diaphragm on said base;
a diaphragm spacer which is located on the side opposite to said valve seat behind said diaphragm and controls the opening position of the aperture of said valve seat by displacing the central part of said diaphragm toward said valve seat or inversely;
a laminated piezoelectric actuator in which a plurality of piezoelectric elements are laminated; and
a stress transferring means which transmits stress generated by expansion of said laminated piezoelectric actuator to said diaphragm spacer, characterized in that;
both said ring-like member and said diaphragm spacer constitute a first thermal shield consisting of a material with a thermal conductivity of 20 W/(m·K) or less, and
a space surrounded by said first thermal shield and said stress transferring means constitutes a second thermal shield; and
a mass flow meter which is disposed in said passage and measures the mass flow rate of fluid.

7. The flow control valve of claim 2, wherein a cooling means is disposed around said laminated piezoelectric actuator.

8. The flow control valve of claim 5, further comprising:
a third thermal shield consisting of a material with a thermal conductivity of 20 W/(m·K) or less between said second thermal shield and said stress transferring means.

9. The flow control valve of claim 5, wherein a cooling means is disposed around said laminated piezoelectric actuator.

10. The flow control valve of claim 8, wherein a cooling means is disposed around said laminated piezoelectric actuator.

11. The mass flow controller of claim 6, wherein the flow control valve further comprises:
a third thermal shield consisting of a material with a thermal conductivity of 20 W/(m·K) or less between said second thermal shield and said stress transferring means.

12. The mass flow controller of claim 6, wherein a cooling means is disposed around said laminated piezoelectric actuator.

13. The mass flow controller of claim 6, wherein said material with a thermal conductivity of 20 W/(m·K) or less is one sort or two sorts of ceramic materials chosen from a group consisting of MACOR (registered trademark) and zirconia.

14. The mass flow controller of claim 6, wherein:
when the temperature of fluid which flows through said passage is 250° C., the temperature of the lower end of said laminated piezoelectric actuator is 110° C. or less; and
when La is defined as the length of said laminated piezoelectric actuator and Ls is defined as the distance from said diaphragm to the lower end of said laminated piezoelectric actuator, the value of La/(La+Ls) is 0.65 or more and 0.95 or less.

15. The mass flow controller of claim 11, wherein a cooling means is disposed around said laminated piezoelectric actuator.

16. The mass flow controller of claim 11, wherein:
when the temperature of fluid which flows through said passage is 250° C., the temperature of the lower end of said laminated piezoelectric actuator is 110° C. or less; and
when La is defined as the length of said laminated piezoelectric actuator and Ls is defined as the distance from said diaphragm to the lower end of said laminated piezoelectric actuator, the value of La/(La+Ls) is 0.65 or more and 0.95 or less.

17. The mass flow controller of claim 12, wherein:
when the temperature of fluid which flows through said passage is 250° C., the temperature of the lower end of said laminated piezoelectric actuator is 110° C. or less; and
when La is defined as the length of said laminated piezoelectric actuator and Ls is defined as the distance from said diaphragm to the lower end of said laminated piezoelectric actuator, the value of La/(La+Ls) is 0.65 or more and 0.95 or less.

18. The mass flow controller of claim 16, wherein a cooling means is disposed around said laminated piezoelectric actuator.

* * * * *